United States Patent [19]

Matsumoto et al.

[11] Patent Number: 4,751,709
[45] Date of Patent: Jun. 14, 1988

[54] SEMICONDUCTOR LASER ARRAY DEVICE

[75] Inventors: Mitsuhiro Matsumoto; Sadayoshi Matsui, both of Tenri; Mototaka Taneya, Nara, all of Japan

[73] Assignee: Sharp Kabushiki Kaisha, Osaka, Japan

[21] Appl. No.: 893,224

[22] Filed: Aug. 5, 1986

[30] Foreign Application Priority Data

Aug. 9, 1985 [JP] Japan ................. 60-176182

[51] Int. Cl.$^4$ ............................... H01S 3/19
[52] U.S. Cl. ....................... 372/50; 372/45; 372/46; 372/48
[58] Field of Search ............. 372/50, 48, 46, 45, 372/44

[56] References Cited

FOREIGN PATENT DOCUMENTS 1150388 7/1983 Canada .................... 372/48

OTHER PUBLICATIONS

D. E. Ackley, D. Botez and B. Bognar, "Phase Locked Injection Laser Arrays with Integrated Phase Shifters", RCA Review, vol. 44, Dec. 1983, pp. 625–633.

Primary Examiner—James W. Davie
Assistant Examiner—Georgia Y. Epps
Attorney, Agent, or Firm—Ciotti & Murashige, Irell & Manella

[57] ABSTRACT

A semiconductor laser array device comprising a plurality of waveguides in a parallel manner to achieve an optical phase coupling therebetween within an active layer, wherein said device includes a region composed of a plurality of waveguide portions in the direction vertical to the waveguide direction, the effective refractive indexes of which are alternately different, whereby optical waves passing through said region attain a 180° phase shift between the waveguide portions having different effective refractive indexes.

4 Claims, 3 Drawing Sheets

SEMICONDUCTOR LASER ARRAY DEVICE

BACKGROUND OF THE INVENTION

1. Field of the Invention

This invention relates to a semiconductor laser array device which emits high-output power laser light with a far-field pattern having a single peak.

2. Description of the Prior Art

Semiconductor laser devices which are useful as light sources of laser discs, space communication systems, etc., must produce high-output power. However, conventional semiconductor laser devices would produce about 80 mW at their best in view of practical use so long as a single filament structure is adopted thereto. Semiconductor laser array devices, in which a plurality of lasing filaments are disposed in a parallel manner on a single substrate, have been studied.

FIG. 7 shows a conventional semiconductor laser array device in which a plurality of lasing filaments 1 are disposed in a parallel manner on a single substrate to achieve an optical phase coupling between the adjacent filaments. When gain is uniformly applied to each of the lasing filaments, the semiconductor laser array device tends to oscillate in a 180° phase-shift mode indicated by reference numeral 3 in FIG. 7, rather than in a 0° phase-shift mode indicated by reference numeral 2 in FIG. 7. This is based on the fact that the optical field distribution is in accord with the gain distribution in the 180° phase-shift mode rather than in the 0° phase-shift mode, resulting in high oscillation gain.

The far-field pattern of laser light in a 0° phase-shift mode attained by a conventional semiconductor laser array device exhibits a single peak as shown in FIG. 6(a), so that the laser light can be concentrated into a single spot fashion by means of an optical lens, while the far-field pattern of laser light in a 180° phase-shift mode attained by a conventional semiconductor laser array device exhibits dual peaks as shown in FIG. 6(b), so that the laser light cannot be concentrated into a single spot fashion by means of any optical lens and is useless as a light source for optical discs, etc. Therefore, the optical phase shift between the adjacent filaments of a semiconductor laser array device is required to be 0°.

SUMMARY OF THE INVENTION

The semiconductor laser array device of this invention, which overcomes the above-discussed and numerous other disadvantages and deficiencies of the prior art, comprises a plurality of waveguides in a parallel manner to achieve an optical phase coupling therebetween within an active layer, wherein said device includes a region composed of a plurality of waveguide portions in the direction vertical to the waveguide direction, the effective refractive indexes of which are alternately different, whereby optical waves passing through said region attain a 180° phase shift between the waveguide portions having different effective refractive indexes.

The active layer has, in a preferred embodiment, alternate portions consisting of flat portions and concaved portions in the direction vertical to the waveguide direction corresponding to said waveguide portions, resulting in said different effective refractive indexes in the direction vertical to the waveguide direction. The flat portions and the concaved portions of said active layer are, in a preferred embodiment, alternately formed by growing said active layer above a V-striped substrate which has a plurality of parallel channels with alternately different depths.

Alternatively, the widths of said waveguide portions are alternately different in the direction vertical to the waveguide direction, resulting in said different effective refractive indexes in the direction vertical to the waveguide direction. The waveguide portions having alternately different widths are, in a preferred embodiment, formed by growing said active layer above a V-striped substrate which has a plurality of parallel channels with alternately different widths.

Thus, the invention described herein makes possible the objects of (1) providing a semiconductor laser array device having a plurality of lasing filaments in a parallel manner to achieve an optical phase coupling therebetween, which produces laser light with the radiation pattern of a single steep peak in a 0° phase-shift mode; and (2) providing a semiconductor laser array device which produces high output power light.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

This invention provides a semiconductor laser array device having a waveguide structure by which laser light of a 180° phase-shift mode is converted into laser light of a 0° phase-shift mode.

Figure 1:
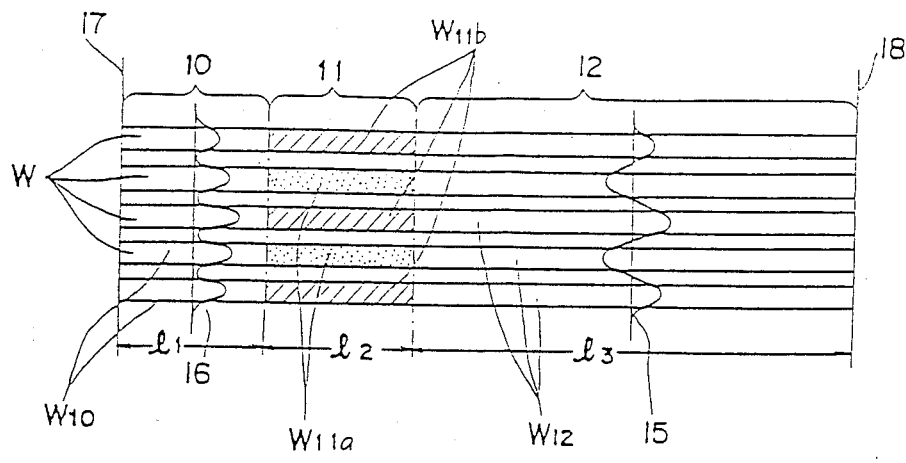
FIG. 1 is a schematic diagram showing the waveguides of a semiconductor laser array device of this invention.

FIG. 1 shows the waveguide structure of a semiconductor laser array device of this invention, in which a plurality of waveguides W, W, . . . are disposed in a parallel manner to achieve an optical phase coupling therebetween. The waveguide structure is composed of three regions 10, 11 and 12 in the waveguide direction. The regions 10 and 12, respectively, are composed of symmetrical waveguide portions $W_{10}$, $W_{10}$, . . . , and $W_{12}$, $W_{12}$, . . . , while the region 11 is composed of unsymmetrical waveguide portions $W_{11a}$, $W_{11a}$, . . . , and $W_{11b}$, $W_{11b}$, . . . , which are alternately positioned in the direction vertical to the waveguide direction, so that the effective refractive index of the waveguide portion $W_{11a}$ is different from that of the waveguide portion $W_{11b}$. The difference in the effective refractive index therebetween is represented by the equation (1):

$$\frac{2\pi}{\lambda_0} \Delta N \cdot l_2 = m\pi \quad (1)$$

wherein m is the odd number, $l_2$ is the length of the waveguide portion $W_{11a}$ or $W_{11b}$, and $\lambda_0$ is the optical wavelength in vacuo.

When optical waves propagated in the symmetrical waveguide portions $W_{10}, W_{10}, \ldots$ and $W_{12}, W_{12}, \ldots$ pass through the unsymmetrical waveguide portions $W_{11a}$ and $W_{11b}$, a 180° phase-shift occurs between the optical waves propagated in the waveguide portions $W_{11a}$ and $W_{11b}$. Thus, light of a 180° phase-shift mode (wherein the optical phase shift between the adjacent waveguides is 180°) is converted into light of a 0° phase-shift mode (wherein the optical phase shift between the adjacent waveguides is 0°) upon passing through the waveguide portions $W_{11a}$ and $W_{11b}$ in the region 11. On the contrary, light of a 0° phase-shift mode is converted into light of a 180° phase-shift mode upon passing therethrough.

When uniform gain is applied to the waveguides W, W, ..., each, the waveguide portions $W_{10}$ and $W_{12}$ of the regions 10 and 12 receive greater gain with regard to the 180° phase-shift mode than with regard to the 0° phase-shift mode, so that light of a 180° phase-shift mode can be propagated in the regions 10 and 12.

In the case that the length $l_1$ of the waveguide portion $W_{10}$ of the region 10 is smaller than the length $l_3$ of the waveguide portion $W_{12}$ of the region 12, when the light 15 of a 180° phase-shift mode in the region 12 passes through the region 11, it is converted into the light 16 of a 0° phase-shift mode, which is then propagated in the region 10 with the same mode. The light of a 0° phase-shift mode is then emitted from the light-emitting facet 17 of the region 10. However, even though light of a 0° phase-shift mode in the region 12 passes through the region 11, it is never converted into light of a 180° phase-shift mode. This is because threshold gain required for oscillation in the former state is lower than that required for oscillation in the latter state.

In the case that $l_1 > l_3$, light of a 0° phase-shift mode is likewise emitted from the light-emitting facet 18 of the region 12. The waveguide structure is not designed for $l_1$ to be equal to $l_3$, because light of a 180° phase-shift mode is mixed with light of a 0° phase-shift mode in both regions 10 and 12, which is undesirable for oscillation.

As mentioned above, the semiconductor laser array device of this invention allows laser light of a 180° phase-shift mode to be converted into laser light of a 0° phase-shift mode in the inside thereof, thereby emitting output power light from one of the facets with the radiation pattern of a single peak in a 0° phase-shift mode.

EXAMPLE 1

Figure 2:
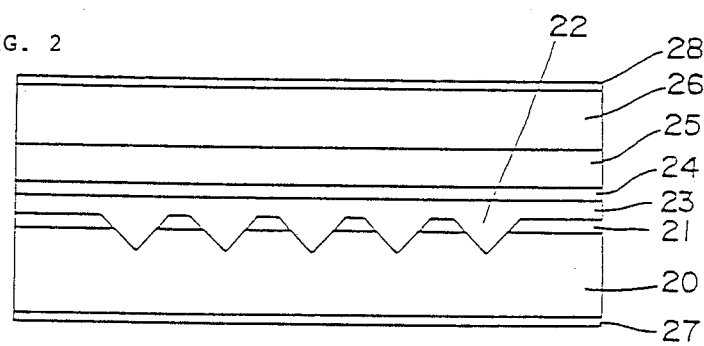
FIG. 2 is a front view showing one of the facets of a semiconductor laser array device of this invention.
Figure 3:
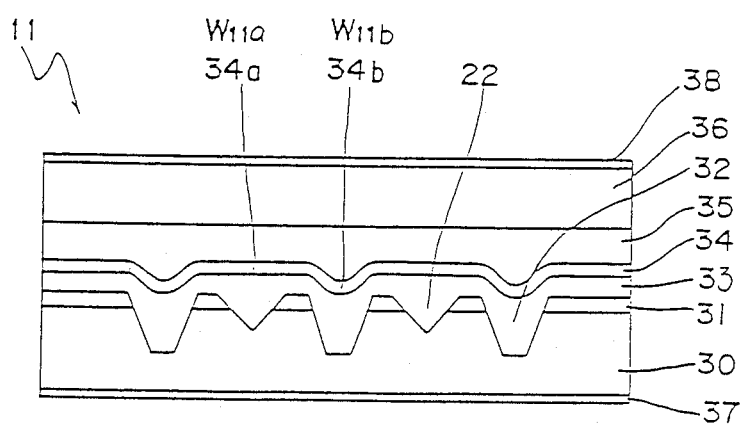
FIG. 3 is a sectional front view showing a portion of the semiconductor laser array device of this invention shown in FIG. 2, in which a 180° phase-shift between the adjacent filaments occurs.

FIG. 2 shows a VSIS (V-channeled substrate inner stripe) semiconductor laser array device of this invention, which is produced as follows: On a p-GaAs substrate 20, an n-GaAs current blocking layer 21 is formed by a crystal growth technique such as liquid phase epitaxy. Then, a plurality of V-striped channels 22 are formed in a parallel manner in the substrate 20 through the current blocking layer 21 by photolithography and an etching technique (FIGS. 1 and 2). Then, the portion corresponding to the region 11 of the channeled substrate 20 is covered with a resist, followed by the formation of openings at the portions of the resist corresponding to the waveguide portions $W_{11b}$. Then, the channeled substrate 20 is subjected to an etching treatment through the openings, resulting in channels 32, the depth of which is deeper than that of the channels 22, as shown in FIG. 3. Thus, the channels 32 and 22 have alternately different depths, which gives the waveguide portions $W_{11a}, W_{11b}$ in the region 11 alternately different effective refractive indexes.

Then, on the channeled substrate (the portions 20 of said substrate having the channels 22 alone corresponding to the regions 10 and 12 and the other portion 30 of said substrate having the channels 22 and 32 corresponding to the region 11), as shown in FIGS. 2 and 3, p-$Al_xGa_{1-x}As$ cladding layers 23 and 33, p- or n-$Al_yGa_{1-y}As$ active layers 24 and 34, and n-$Al_xGa_{1-x}As$ cladding layers 25 and 35 are successively formed corresponding to the regions 11 & 12, and 11, respectively, by liquid phase epitaxy (wherein x>y), followed by the formation thereon $n^+$-GaAs cap layers 26 and 36. The portions of the active layer 24 corresponding to the regions 10 and 12 are formed into a flat shape as shown in FIG. 2, while the portions 34a of the active layer 34 positioned above the channels 22 corresponding to the waveguide portions $W_{11a}$ of the region 11 are formed into a flat shape and the portions 34b of the active layer 34 positioned above the channels 32 corresponding to the waveguide portions $W_{11b}$ of the region 11 are formed into a concaved shape due to the difference in the depth between the channels 22 and 32, as shown in FIG. 3. Given that the difference in the effective refractive index between the adjacent waveguide portions $W_{11a}$ and $W_{11b}$ is $\Delta N$, the length $l_2$ of the region 11 is set to satisfy the afore-mentioned equation (1).

Then, p-ohmic electrodes 27 and 37 are formed on the back faces of the corresponding portions 20 and 30 of the substrate, respectively, and n-ohmic electrodes 28 and 38 are formed on the upper faces of the cap layers 26 and 36, respectively, followed by cleaving to form mirrors at the facets, resulting in a semiconductor laser array unit having an internal cavity length of 200–300 μm. The unit is then mounted on a copper block by the use of a soldering material to form a semiconductor laser array device of this invention.

EXAMPLE 2

Figure 4:
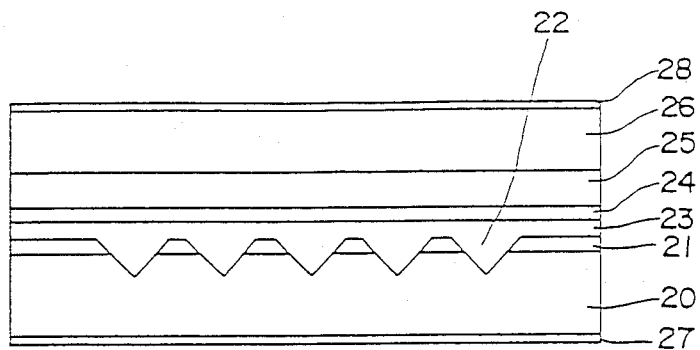
FIG. 4 is a front view showing one of the facets of another semiconductor laser array device of this invention.
Figure 5:
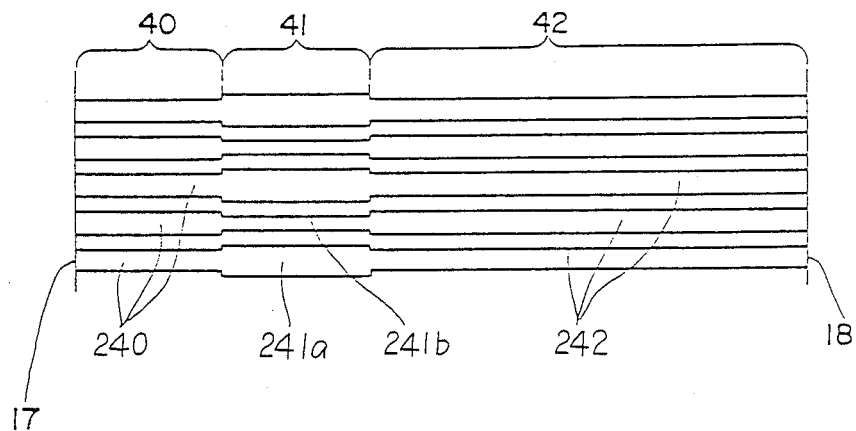
FIG. 5 is a schematic diagram showing the waveguides of the semiconductor laser array device shown in FIG. 4.

FIG. 4 shows another VSIS semiconductor laser array device of this invention, which is produced as follows: On a p-GaAS substrate 20, an n-GaAs current blocking layer 21 is formed by liquid phase epitaxy. Then, a plurality of V-striped channels 240 and 242 are formed in a parallel manner in the portions of the substrate 20 through the current blocking layer 21 corresponding to the regions 40 and 42, respectively and a plurality of V-channels 241a and 241b, the widths of which are different, are alternately formed in a parallel manner in the portion of the substrate 20 through the current blocking layer 21 corresponding to the region 41 positioned between the regions 40 and 42. On the current blocking layer 21 including the channels 240, 241a, 241b, and 242, a cladding layer 23, an active layer 24, a cladding layer 25, and a cap layer 26 are successively grown by liquid phase epitaxy, so that wide waveguides and narrow waveguides can be formed above the wide channels 241a and the narrow channels 241b, respectively. Given that the difference in effective refractive index between the wide waveguides and the narrow waveguides is ΔN, the length $l_2$ of the region 41 is set to satisfy the aforementioned equation (1). The succeeding processes for the production of the device is the same as those of Example 1.

Figure 6A:
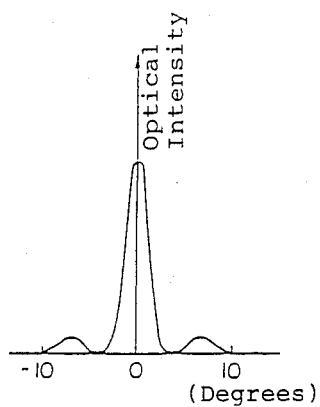
FIGS. 6(a) and 6(b) are curves showing the far-field patterns in the horizontal direction attained by the semiconductor laser array device of this invention.
Figure 6B:
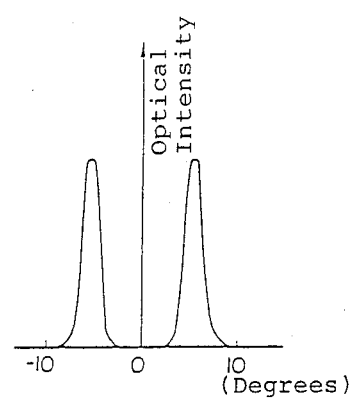
Figure 7:
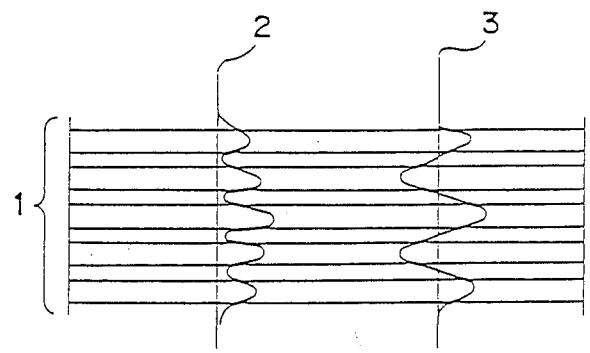
FIG. 7 is a schematic diagram showing waveguides positioned in a parallel manner to achieve an optical phase coupling therebetween and modes of an optical wave propagated in the waveguides.

The semiconductor laser array device obtained in each of the above-mentioned examples, wherein the afore-mentioned equation (1) is, of course, satisfied, oscillated laser light in a single transverse mode up to an output power of 100 mW at a threshold current of 150 mA from the facet 17, which belongs to the region 11 or 41 where a 180° optical phase-shift occurs between the adjacent waveguides. The far-field pattern of this device exhibits a single steep peak having a lobe full-width of the half maximum of 4°, as shown in FIG. 6(a), indicating that the device produces laser light with a 0° phase-shift between the adjacent waveguides. Moreover, laser light from the other facet 18 opposite to the facet 17 is oscillated in a single transverse mode up to an output power of 100 mW and its far-field pattern exhibits dual peaks (with a distance of 9° therebetween) as shown in FIG. 6(b), indicating that the facet 18 of the device emits laser light with a 180° phase-shift between the adjacent waveguides.

Thus, it can be seen that a semiconductor laser array device, which is provided with the waveguided portions by which a 180° optical phase-shift can be attained between the adjacent waveguides, produces output light of a 0° phase-shift mode.

Although the above-mentioned examples disclose only the GaAs-GaAlAs system, this invention is, of course, applicable to other semiconductor materials such as the InP-InGaAsP system, etc. Moreover, as the striped structure, inner stripe structures other than the VSIS structure, and other device structures can be used.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser array device comprising a plurality of waveguides in a parallel manner to achieve an optical phase coupling therebetween within an active layer,
    said device includes a first region, a second region, and a third region which are successively positioned along the waveguide direction, each of said regions being composed of a plurality of waveguide portions in the direction vertical to the waveguide direction,
    one of said first and third regions is longer than the other one, and
    the part of said active layer in said second region has alternate portions consisting of flat portions and concaved portions in the direction vertical to the waveguide direction, resulting in that the effective refractive indexes of the waveguide portions in said second region are alternatively different, the difference ΔN in the effective refractive indexes between adjacent waveguide portions being represented by the following formula:

$$\frac{2\pi}{\lambda_o} \Delta N \cdot l_2 = m\pi$$

wherein m is an odd number, $l_2$ is the length of said second region, and $\lambda_o$ is the wavelength of light in vacuo.

2. A semiconductor laser array device according to claim 1, wherein the flat portions and the concaved portions of said active layer are alternately formed by growing said active layer above a V-striped substrate which has a plurality of parallel channels with alternately different depths.

3. In a semiconductor laser array device comprising a plurality of waveguides in a parallel manner to achieve an optical phase coupling therebetween within an active layer,
    said device includes a first region, a second region, and a third region which are successively positioned along the waveguide direction, each of said regions being composed of a plurality of waveguide portions in the direction vertical to the waveguide direction,
    one of said first and third regions is longer than the other one, and
    the widths of said waveguide portions in said second region are alternatively different in the direction vertical to the waveguide direction, resulting in that the effective refractive indexes of the waveguide portions in said second region and alternatively different, the difference ΔN in the effective refractive indexes between adjacent waveguide portions being represented by the following formula:

$$\frac{2\pi}{\lambda_o} \Delta N \cdot l_2 = m\pi$$

wherein m is an odd number, $l_2$ is the length of said second region, and $\lambda_o$ is the wavelength of light in vacuo.

4. A semiconductor laser array device according to claim 3, wherein said waveguide portions having alternately different widths are formed by growing said active layer above a V-striped substrate which has a plurality of parallel channels with alternately different widths.

* * * * *